(12) United States Patent
Mihara

(10) Patent No.: US 9,735,708 B2
(45) Date of Patent: Aug. 15, 2017

(54) PIEZOELECTRIC POWER GENERATION

(71) Applicant: EMPIRE TECHNOLOGY DEVELOPMENT LLC, Wilmington, DE (US)

(72) Inventor: Masaaki Mihara, Chiba (JP)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 462 days.

(21) Appl. No.: 14/394,475

(22) PCT Filed: Oct. 7, 2013

(86) PCT No.: PCT/US2013/063607
§ 371 (c)(1),
(2) Date: Oct. 15, 2014

(87) PCT Pub. No.: WO2015/053735
PCT Pub. Date: Apr. 16, 2015

(65) Prior Publication Data
US 2016/0072411 A1    Mar. 10, 2016

(51) Int. Cl.
*H02N 2/18* (2006.01)
*H01L 41/113* (2006.01)
(Continued)

(52) U.S. Cl.
CPC .......... *H02N 2/181* (2013.01); *H01L 41/042* (2013.01); *H01L 41/0536* (2013.01);
(Continued)

(58) Field of Classification Search
CPC ................. H02N 2/18; H02N 2/186
(Continued)

(56) References Cited

U.S. PATENT DOCUMENTS 5,438,553 A * 8/1995 Wilson .................. B06B 1/0688
250/338.3
8,803,341 B2 * 8/2014 Hendrickson ............. E01C 9/00
290/1 R
(Continued)

FOREIGN PATENT DOCUMENTS

EP         2541753 A2    1/2013
JP      2009268262 A   11/2009
(Continued)

OTHER PUBLICATIONS

International Search Report and Written Opinion of the International Searching Authority, International application No. PCT/US2013/063607, Jun. 25, 2014.
(Continued)

*Primary Examiner* — Thomas Dougherty
(74) *Attorney, Agent, or Firm* — Turk IP Law, LLC

(57) ABSTRACT

Technologies are generally described for generating electrical power from piezoelectric power. Example devices/systems described herein may use one or more of a piezoelectric device, a plurality of solid particles, and/or a container. In various examples, an electrical power generator apparatus is described, where the apparatus may be configured to provide an electrical signal upon application of a mechanical stress to the piezoelectric device. Some example apparatus may also be configured to contain the plurality of solid particles in the container, which may be coupled to at least a portion of a surface of the piezoelectric device. When a mechanical force is exerted on the plurality of solid particles, the plurality of solid particles may be effective to receive at least a portion of the mechanical force and responsively apply the mechanical stress to the piezoelectric device.

31 Claims, 12 Drawing Sheets

(51) Int. Cl.
H01L 41/04 (2006.01)
H01L 41/053 (2006.01)
H01L 41/18 (2006.01)
H01L 41/083 (2006.01)

(52) U.S. Cl.
CPC .......... H01L 41/083 (2013.01); H01L 41/113 (2013.01); H01L 41/18 (2013.01); H02N 2/18 (2013.01); H01L 41/0833 (2013.01)

(58) Field of Classification Search
USPC ........................................................ 310/339
See application file for complete search history.

(56) References Cited

U.S. PATENT DOCUMENTS

| 2008/0136290 A1 | 6/2008 | Lee |
| 2008/0136562 A1 | 6/2008 | Kulah et al. |
| 2008/0143214 A1 | 6/2008 | McNamara et al. |
| 2012/0119624 A1 | 5/2012 | Vamvas |
| 2015/0346182 A1* | 12/2015 | Mallela .................. G01L 1/22 73/803 |

FOREIGN PATENT DOCUMENTS

| JP | 2011097687 A | 5/2011 |
| KR | 20090107831 A | 10/2009 |

OTHER PUBLICATIONS

Seok-Min Jung et al., "Energy-Harvesting Device with Mechanical Frequency-Up Conversion Mechanism for Increased Power Efficiency and Wideband Operation", Applied Physics Letters, 2010, pp. 111906-1-11906-3, vol. 96, Issue 11.

Ibrahim Sari et al., "An Electromagnetic Micro Power Generator for Low-Frequency Environmental Vibrations Based on the Frequency Upconversion Technique", Journal of Microelectromechanical Systems, Feb. 2010, pp. 14-27, vol. 19, No. 1.

\* cited by examiner

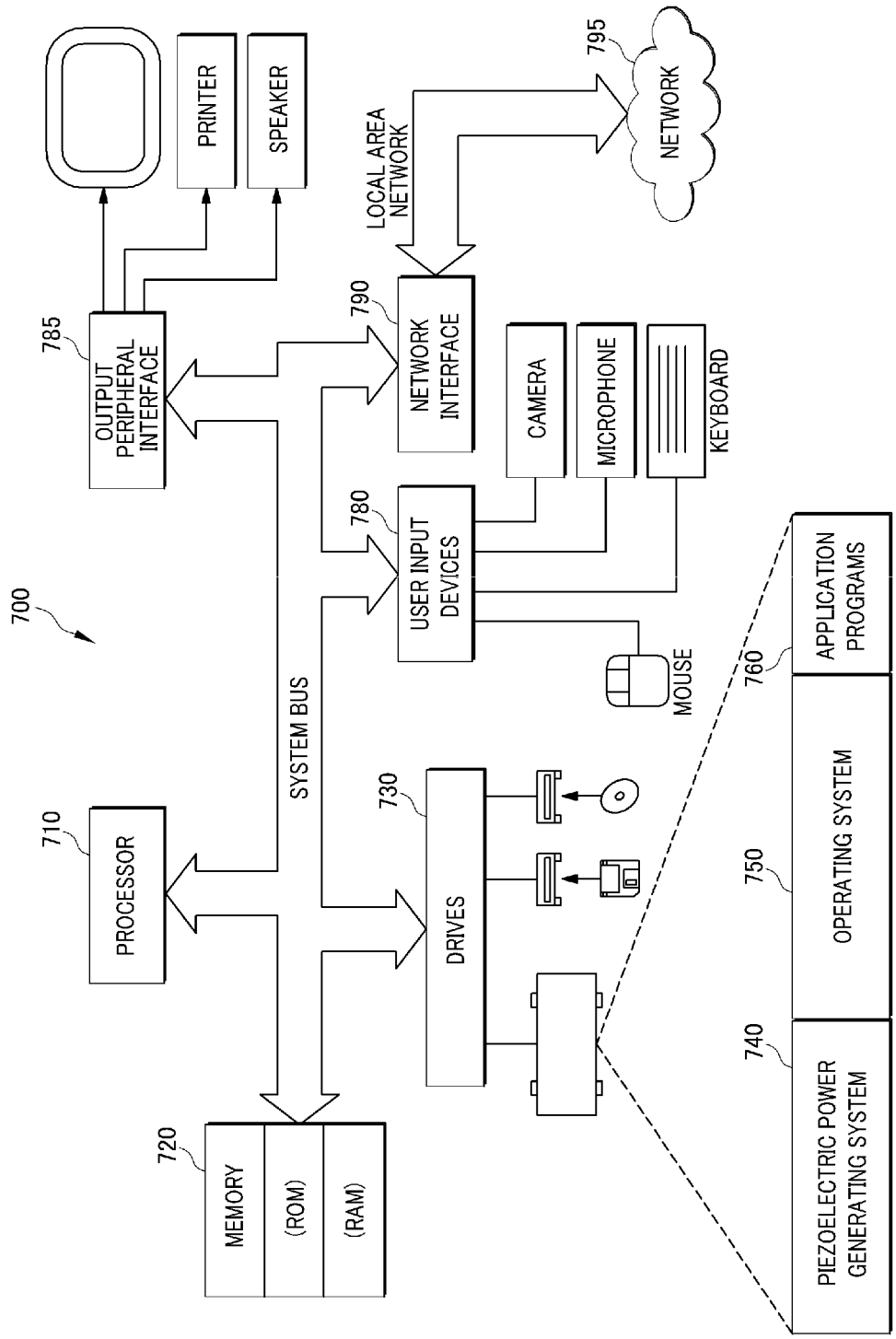

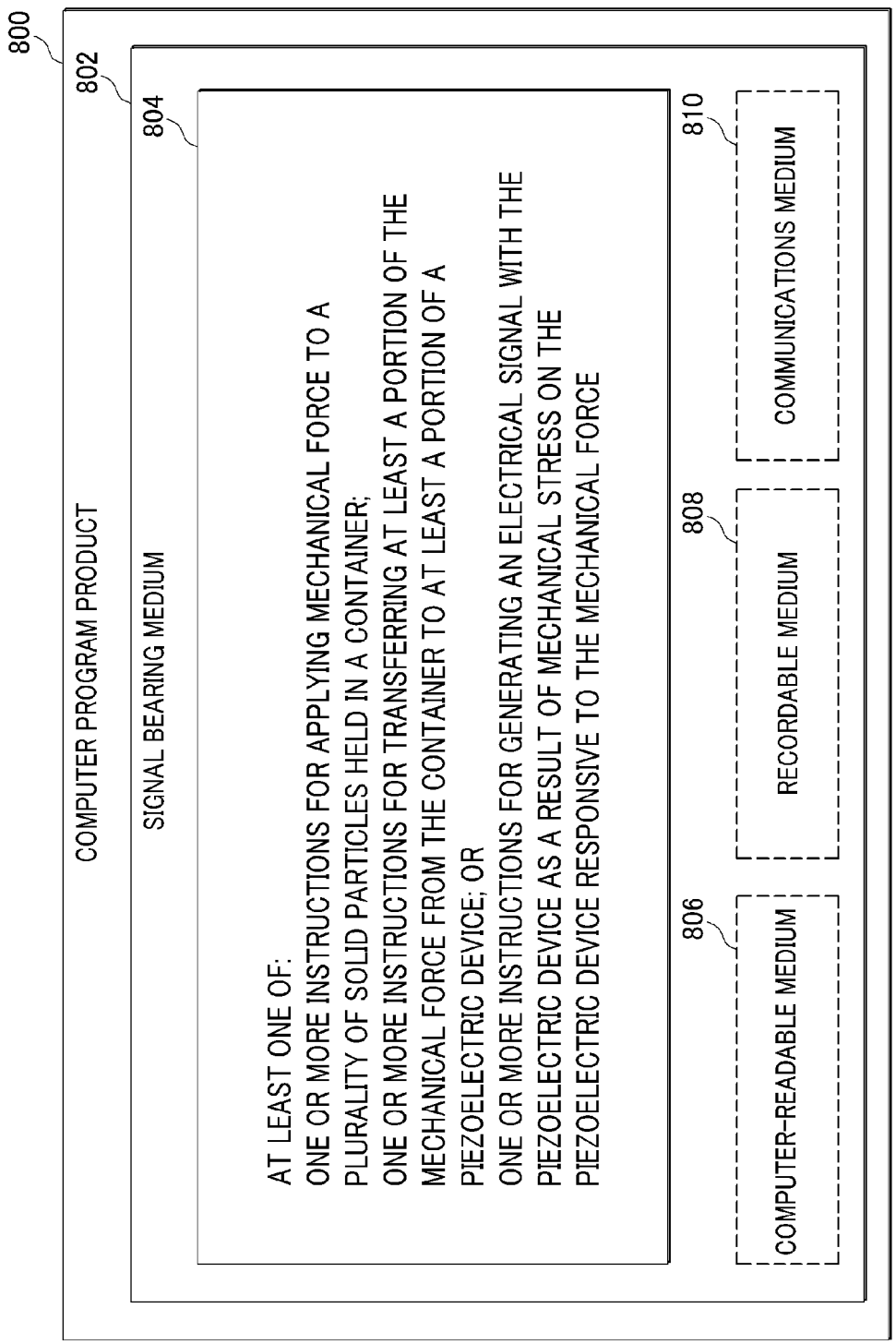

FIG. 8

COMPUTER PROGRAM PRODUCT 800
SIGNAL BEARING MEDIUM 802

804
AT LEAST ONE OF:
ONE OR MORE INSTRUCTIONS FOR APPLYING MECHANICAL FORCE TO A PLURALITY OF SOLID PARTICLES HELD IN A CONTAINER;
ONE OR MORE INSTRUCTIONS FOR TRANSFERRING AT LEAST A PORTION OF THE MECHANICAL FORCE FROM THE CONTAINER TO AT LEAST A PORTION OF A PIEZOELECTRIC DEVICE; OR
ONE OR MORE INSTRUCTIONS FOR GENERATING AN ELECTRICAL SIGNAL WITH THE PIEZOELECTRIC DEVICE AS A RESULT OF MECHANICAL STRESS ON THE PIEZOELECTRIC DEVICE RESPONSIVE TO THE MECHANICAL FORCE

| COMPUTER-READABLE MEDIUM 806 | RECORDABLE MEDIUM 808 | COMMUNICATIONS MEDIUM 810 |

PIEZOELECTRIC POWER GENERATION

CROSS REFERENCE TO RELATED APPLICATION

The present application is a U.S. National Stage filing under 35 U.S.C. §371 of International Application No. PCT/US2013/063607, filed on Oct. 7, 2013, entitled " PIEZOELECTRIC POWER GENERATION." The International Application, including any appendices or attachments thereof, is hereby incorporated by reference in its entirety.

BACKGROUND

Unless otherwise indicated herein, the approaches described in this section are not prior art to the claims in this application and are not admitted to be prior art by inclusion in this section.

A piezoelectric device can be used to generate electrical power when a mechanical force is applied on it. For example, a piezoelectric device may include a stack of thin layers of piezoelectric materials, such as quartz, tourmaline, plumbum zirconate titanate (PZT), plumbum magnesium niobate (PMN), etc., and thin metallic electrode layers interposed between the piezoelectric material layers. The electrode layers of the piezoelectric device can be connected in series to increase the combined voltage or connected in parallel to increase the current. Also, the electrical power generated by the piezoelectric device can be provided in AC or DC form, which can be stored in an electrical storage device such as a capacitor.

Some piezoelectric devices typically can have a resonant characteristic in converting a mechanical force into an electrical power. Thus, when the mechanical force makes the piezoelectric device operate out of such resonant characteristic, the power generation efficiency may be deteriorated.

SUMMARY

Technologies generally described herein relate to generation of electrical power using a piezoelectric device.

Various example apparatus configured to generate an electrical power described herein may include one or more of a piezoelectric device, a plurality of solid particles, and/or a container. The piezoelectric device may be configured to provide an electrical signal upon application of a mechanical stress to the piezoelectric device. The container may be coupled to at least a portion of a surface of the piezoelectric device and may be configured to contain the plurality of solid particles. When a mechanical force is exerted on the plurality of solid particles, the plurality of solid particles may be effective to receive at least a portion of the mechanical force and responsively apply the mechanical stress to the piezoelectric device.

In some examples, an electrical power generation system is described such as any example system described herein that may be adapted to utilize a plurality of piezoelectric devices, a plurality of solid particles, and/or a container. Each of the plurality of piezoelectric devices may be configured to provide a respective electrical signal in response to applied mechanical stress on the piezoelectric device. The container may be coupled to at least a portion of a surface of each of the plurality of piezoelectric devices and may be configured to contain the plurality of solid particles. When a mechanical force is exerted on the plurality of solid particles, the plurality of solid particles may receive at least a portion of the mechanical force and responsively apply the mechanical stress to at least one of the plurality of piezoelectric devices.

In some examples, methods for electrical power in an electrical power generator are described. Example methods may include applying mechanical force to a plurality of solid particles held in a container. At least a portion of the mechanical force may be transferred from the container to at least a portion of a piezoelectric device. An electrical signal may be generated with the piezoelectric device as a result of stress on the piezoelectric device responsive to the mechanical force.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE FIGURES

The foregoing and other features of this disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings, in which:

FIG. 7 shows a schematic block diagram illustrating an example computing system that can be configured to implement methods for generating electrical power in a piezoelectric power generator; and FIG. 8 illustrates computer program products that can be utilized to generate electrical power in a piezoelectric power generator, all arranged in accordance with at least some embodiments described herein.

DETAILED DESCRIPTION

Figure 1:
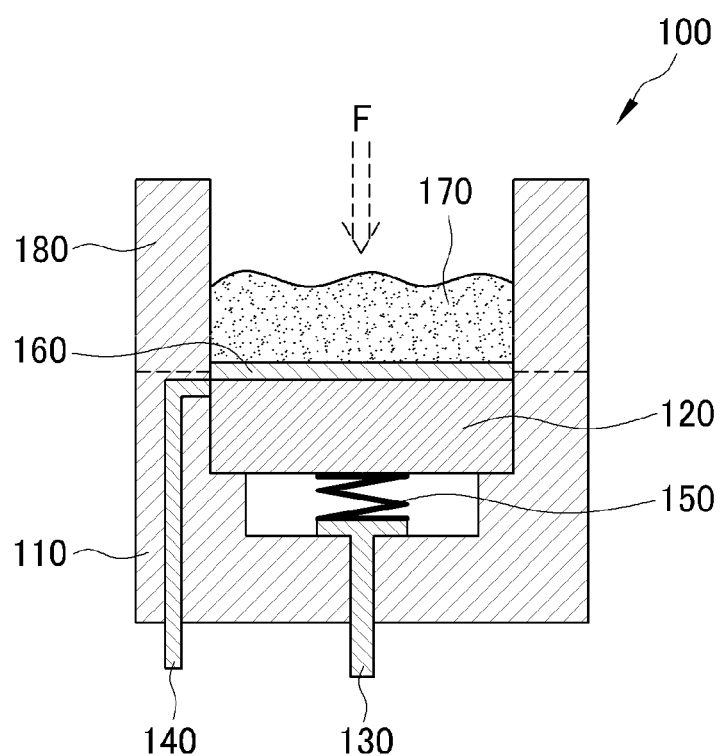
FIG. 1 schematically shows a cross-sectional view of an example piezoelectric power generator configured to generate electrical power upon application of a mechanical force on a plurality of solid particles contained in the piezoelectric power generator.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

This disclosure is generally drawn, inter alia, to methods, apparatus, systems, devices and computer program products related to generation of electrical power using one or more piezoelectric devices.

Briefly stated, technologies are generally described for generating electrical power from a piezoelectric power. Example devices/systems described herein may use one or more of a piezoelectric device, a plurality of solid particles and/or a container. In various examples, an electrical power generator apparatus is described, where the apparatus may be configured to provide an electrical signal upon application of a mechanical stress to the piezoelectric device. Some example apparatus may also be configured to contain the plurality of solid particles in the container, which may be coupled to at least a portion of a surface of the piezoelectric device. When a mechanical force is exerted on the plurality of solid particles, the plurality of solid particles may be effective to receive at least a portion of the mechanical force and responsively apply the mechanical stress to the piezoelectric device.

FIG. 1 schematically shows a cross-sectional view of an example piezoelectric power generator configured to generate electrical power upon application of a mechanical force on a plurality of solid particles contained in the piezoelectric power generator, arranged in accordance with at least some embodiments described herein. As depicted, a piezoelectric power generator 100 may include one or more of a lower container 110, a piezoelectric device 120 having a top surface 160 and provided in lower container 110, a first output wire 130 electrically coupled to piezoelectric device 120 via a contact spring 150, a second output wire 140 electrically coupled to piezoelectric device 120, and/and a upper container 180 coupled to top surface 160 and configured to contain a plurality of solid particles 170.

In operation, piezoelectric device 120 may be configured to provide an electrical signal upon application of a mechanical force on top surface 160 of piezoelectric device 120. For example, piezoelectric device 120 may include one or more plates of piezoelectric material. More specifically, piezoelectric device 120 may include a stack of thin layers of piezoelectric materials and thin metallic electrode layers interposed between the piezoelectric material layers. Example materials that may be suitable as piezoelectric materials include quartz, tourmaline, plumbum zirconate titanate (PZT), plumbum magnesium niobate (PMN), to name a few. The electrode layers of piezoelectric device 120 may be coupled together in series to increase the combined voltage or connected in parallel to increase the current. Also, the electrical signal generated by piezoelectric device 120 may be provided through first and second output wires 130 and 140 in either AC or DC form, which can be stored in an electrical storage device such as a capacitor (not shown).

Figure 2:
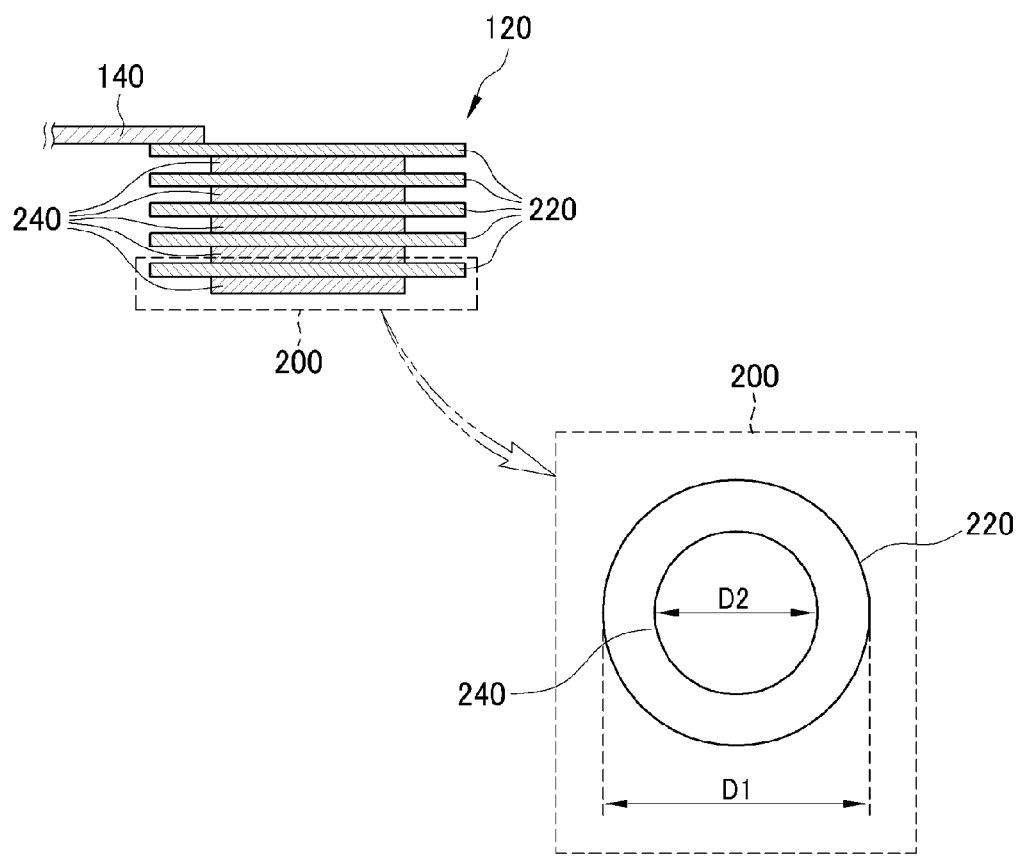
FIG. 2 schematically shows a cross-sectional view and a plane view of an example piezoelectric device including a stack of plates of piezoelectric material.

FIG. 2 schematically shows a cross-sectional view and a plane view of an example piezoelectric device including a stack of plates of piezoelectric material, arranged in accordance with at least some embodiments described herein. As illustrated, piezoelectric device 120 may include a stack of thin metallic electrode layers 220 and thin piezoelectric material layers 240. Thin metallic electrode layers 220 can be interposed between adjacent ones of the piezoelectric material layers 240 in an interdigitated configuration.

In some embodiments, piezoelectric material layers 240 may be made of any suitable piezoelectric material including at least one of quartz, tourmaline, PZT, PMN, etc. Also, a pair 200 of thin metallic electrode layer 220 and thin piezoelectric material layer 240 may be mounted by gluing them on each other by cold or hot curing epoxy. Then, multiple pairs 200 of thin metallic electrode layer 220 and thin piezoelectric material layer 240 may be mounted by gluing them on each other in a similar manner.

In some embodiments, each of thin metallic electrode layers 220 and thin piezoelectric material layers 240 may have a circular shape, as illustrated in a lower right portion of FIG. 2. In some other embodiments, each of thin metallic electrode layers 220 and thin piezoelectric material layers 240 may have any other suitable shape including a rectangular shape, a polygonal shape, etc.

In some embodiments, since pairs 200 of thin metallic electrode layer 220 and thin piezoelectric material layer 240 may be vertically stacked and electrically coupled in series, this circuit configuration may provide a voltage output that combines voltages generated from each pair 200 of thin metallic electrode layer 220 and thin piezoelectric material layer 240. In some other embodiments, pairs 200 of thin metallic electrode layer 220 and thin piezoelectric material layer 240 may be configured to be coupled in parallel, which may combine currents generated from each pair 200 of thin metallic electrode layer 220 and thin piezoelectric material layer 240.

In some embodiments, a thickness of each of thin metallic electrode layers 220 and thin piezoelectric material layers 240 may be, but not limited to, about 1 mm or less. A diameter D1 of thin metallic electrode layer 220 may be, but not limited to, about 11 mm. Also, a diameter D2 of thin piezoelectric material layer 240 may be, but not limited to, about 8 mm.

Referring back to FIG. 1, piezoelectric device 120 may be configured to generate and provide an electrical signal through first and second output wires 130 and 140, which may function as electrodes, such as an anode and a cathode, respectively. In some embodiments, first output wire 130 may be coupled to piezoelectric device 120 via contact spring 150, which may be made of any suitable conductive material such as metallic material. Contact spring 150 may be configured to absorb a deformation of a bottom surface of piezoelectric device 120 when a mechanical force is exerted on top surface 160 of piezoelectric device 120. In some other embodiments, first output wire 130 may be coupled to piezoelectric device 120 without contact spring 120.

In some embodiments, top surface 160 of piezoelectric device 120 may include an elastomer material configured to prevent the plurality of solid particles 170 from leaking into piezoelectric device 120. The elastomer material may include at least one of silicon rubber, chloroprene rubber, and/or fluoroelastomer.

In some embodiments, upper container 180, coupled to top surface 160 of piezoelectric device 120 and coupled to lower container 110, may be configured to contain the plurality of solid particles 170. When a mechanical force F is exerted on solid particles 170, solid particles 170 may receive at least a portion of the mechanical force F and responsively apply a mechanical stress (e.g., a pulse-patterned force) on at least a portion of top surface 160 of piezoelectric device 120. Such mechanical force conversion may be caused by a stick-slip phenomenon (or slip-stick phenomenon), which refers to a spontaneous jerking motion occurring when adjacent solid particles 170 are sliding over each other. In particular, the stick-slip may be caused by the surfaces of solid particles 170 alternating between sticking to each other and sliding over each other, with a corresponding change in the force of friction. Thus converted pulse-patterned force, which may be applied on top surface 160 of piezoelectric device 120, may be efficiently converted into an electrical signal by piezoelectric device 120.

In some embodiments, the plurality of solid particles 170 may include a plurality of natural D-glucose particles. For examples, the natural D-glucose particles may include a plurality of potato starch, each having a diameter in a range of about 2 µm to about 80 µm. In some other embodiments, the plurality of solid particles 170 may include a plurality of glass particles that include quartz material having a diameter in a range of about 200 µm to about 1 mm. Alternatively, the plurality of solid particles 170 may include a plurality of solid plastic particles that include unsaturated polyester resin having a diameter in a range of about 200 µm to about 1 mm.

Figure 3:
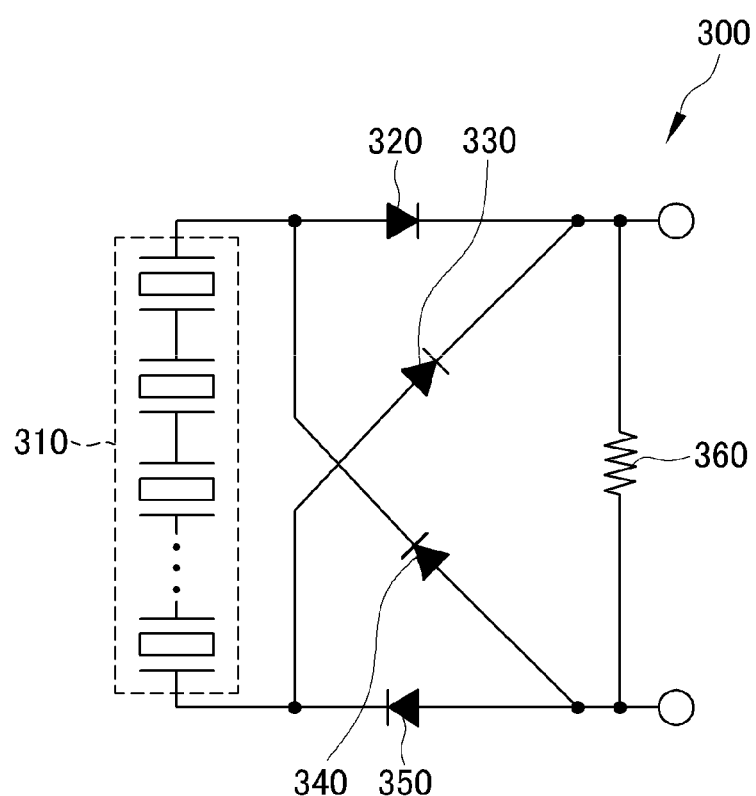
FIG. 3 schematically shows a diagram of an example rectifier circuit electrically coupled to a piezoelectric device.

In some embodiments, piezoelectric power generator 100 may further include a rectifier configured to receive the electrical signal from piezoelectric device 120 and generate rectified waveforms. FIG. 3 schematically shows a diagram of an example rectifier circuit electrically coupled to a piezoelectric device, arranged in accordance with at least some embodiments described herein. As depicted, a piezoelectric device 310 may be electrically coupled to a rectifier 300 including diodes 320, 330, 340 and 350 and a resistance 360. Piezoelectric device 310 may have a similar configuration to piezoelectric device 120 (or piezoelectric power generator 100) as described above with reference to FIGS. 1 and 2.

In some embodiments, rectifier 300 may be configured to receive an electrical signal from piezoelectric device 310 and generate rectified waveforms such as pulse waveforms. Specifically, piezoelectric materials in piezoelectric device 310 may become electrically polarized when subjected to a mechanical force. For example, tension and compression of the piezoelectric materials generate voltages of opposite polarity in proportion to the applied force. Thus, piezoelectric device 310 may generate a positive electrical waveform signal when a mechanical force (e.g., mechanical force F) is exerted on piezoelectric device 310 and causes a deformation of piezoelectric device 310. On the other hand, piezoelectric device 310 may generate a negative electrical waveform signal when the mechanical force is no longer exerted on piezoelectric device 310 and thus the deformed portion is restored to its original shape. Such alternating electrical waveform signals may be effectively converted into pulse waveform signals by rectifier 300.

In some other embodiments, piezoelectric power generator 100 may further include a capacitor configured to receive the electrical signal (e.g., current) from piezoelectric device 120 and store charges from the electrical signal. In this manner, the capacitor may be configured to convert the electrical signal generated from piezoelectric device 120 into a DC signal.

Figure 4A:
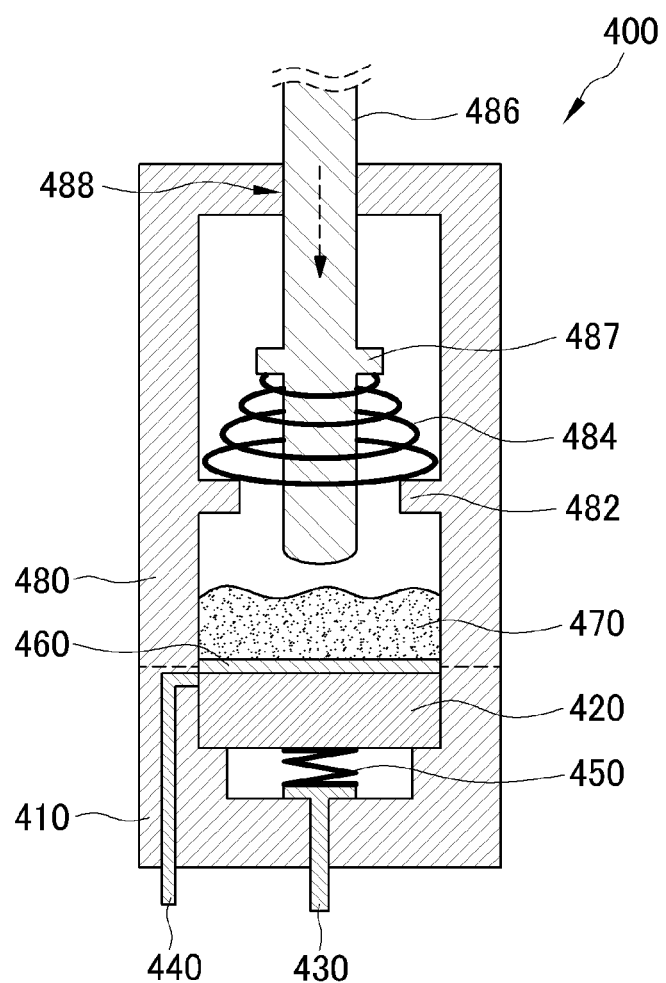
FIGS. 4A and 4B schematically show cross-sectional views of an example piezoelectric power generator configured to generate electrical power upon application of a mechanical force by a pressure element on a plurality of solid particles contained in the piezoelectric power generator.
Figure 4B:
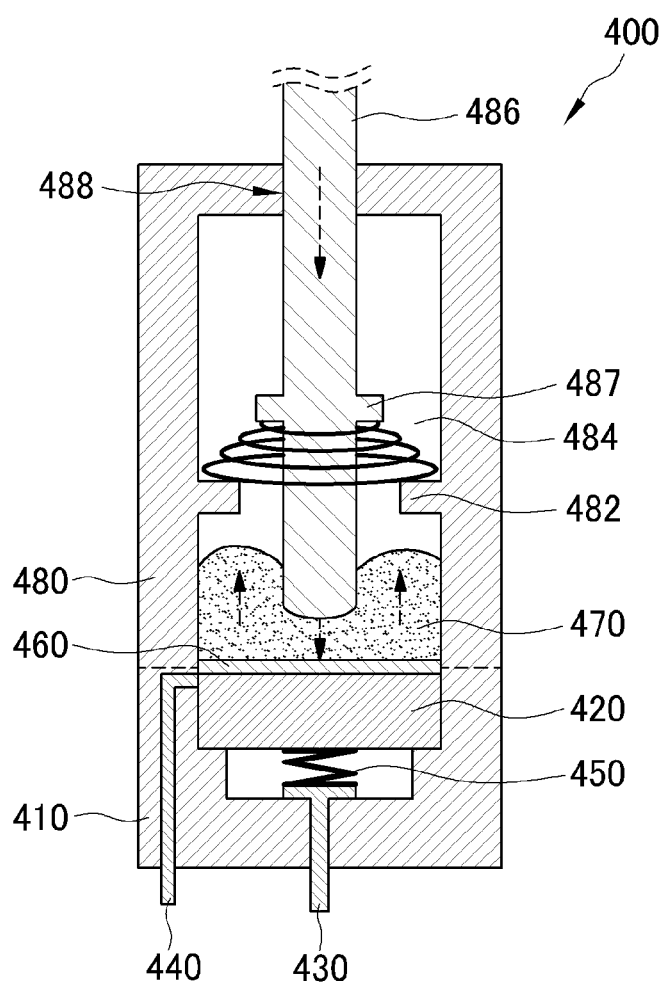

FIGS. 4A and 4B schematically show cross-sectional views of an example piezoelectric power generator configured to generate electrical power upon application of a mechanical force by a pressure element on a plurality of solid particles contained in the piezoelectric power generator, arranged in accordance with at least some embodiments described herein. As depicted, a piezoelectric power generator 400 may include one or more of a lower container 410, a piezoelectric device 420 having a top surface 460 and provided in lower container 410, a first output wire 430 electrically coupled to piezoelectric device 420 via a contact spring 450, and/or a second output wire 440 electrically coupled to piezoelectric device 420. Elements 410 to 460 may be arranged in a similar configuration to elements 110 to 160, respectively, as described above with reference to FIGS. 1 and 2. Thus, a detailed description of elements 410 to 460 is omitted for the sake of simplicity.

In some embodiments, piezoelectric device 420 may further include an upper container 480, coupled to top surface 460 of piezoelectric device 420 and coupled to lower container 410, configured to contain a plurality of solid particles 470. As illustrated in FIG. 4A, upper container 480 may include a horizontal protrusion 482 formed at an inner sidewall of upper container 480. Protrusion 482 may be configured to support a spring member 484 on an upper surface of protrusion 482. Further, piezoelectric device 420 may include a pressure element 486 (e.g., a rod-like shaped device) that may be configured for insertion into a through-hole 488 formed in an upper surface of upper container 480. Pressure element (or pressure rod) 496 may have a horizontal protrusion 487 formed at its side wall, such that when pressure element 486 vertically moves through through-hole 488, protrusion 487 of pressure element 486 can exert a force on spring member 484.

As depicted in FIG. 4B, when a mechanical force is exerted on pressure element 486, pressure element 486 may move through through-hole 488 and protrusion 487 of pressure element 486 may exert a force on spring member 484. Further, as pressure element 486 moves, a bottom surface of pressure element 486 may exert a mechanical force onto solid particles 470. In the same manner as described above with reference to solid particles 170 in FIG. 1, solid particles 470 may receive at least a portion of the linear mechanical force and responsively apply a mechanical stress (e.g., a pulse-patterned force) on top surface 460 of piezoelectric device 420. Thus converted pulse-patterned force, which may be applied on top surface 460 of piezoelectric device 420, may be efficiently converted into an electrical signal by piezoelectric device 420.

In some embodiments, the plurality of solid particles 470 may include a plurality of natural D-glucose particles such as a plurality of potato starch having a diameter of about 50 µm. In some other embodiments, the plurality of solid particles 470 may include a plurality of glass particles including quartz material having a diameter in a range of about 200 µm to about 1 mm. Alternatively, the plurality of solid plastic particles including unsaturated polyester resin having a diameter in a range of about 200 µm to about 1 mm.

In some embodiments, piezoelectric power generator 400 may further include a rectifier, such as rectifier 300, configured to receive the electrical signal from piezoelectric device 420 and responsively generate rectified waveforms.

Specifically, piezoelectric materials in piezoelectric device 420 may become electrically polarized when subjected to a mechanical force. For example, tension and compression of the piezoelectric materials generate voltages of opposite polarity in proportion to the applied force. Thus, piezoelectric device 420 may generate a positive electrical waveform signal when the mechanical force by pressure element 486 is exerted on piezoelectric device 420 and causes a deformation of piezoelectric device 420. On the other hand, piezoelectric device 420 may generate a negative electrical waveform signal when the mechanical force is no longer exerted on piezoelectric device 420 and thus the deformed portion is restored to its original shape. Such alternating electrical waveform signals may be effectively converted into pulse waveform signals by the rectifier.

Figure 5A:
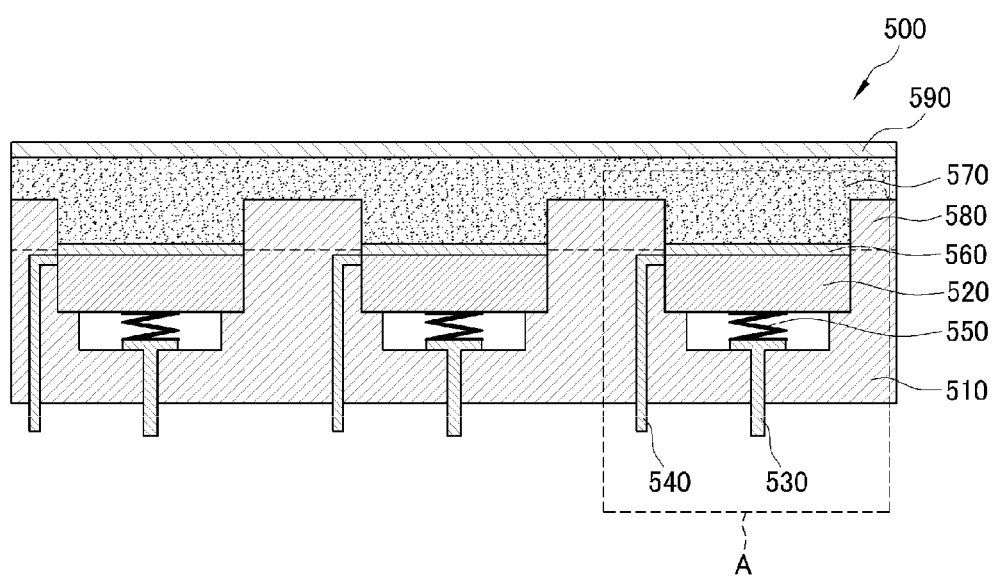
FIGS. 5A and 5B schematically show cross-sectional views of an example piezoelectric power generation system configured to generate electrical power upon application of a mechanical force on a plurality of solid particles contained in a plurality of piezoelectric power generators.
Figure 5B:
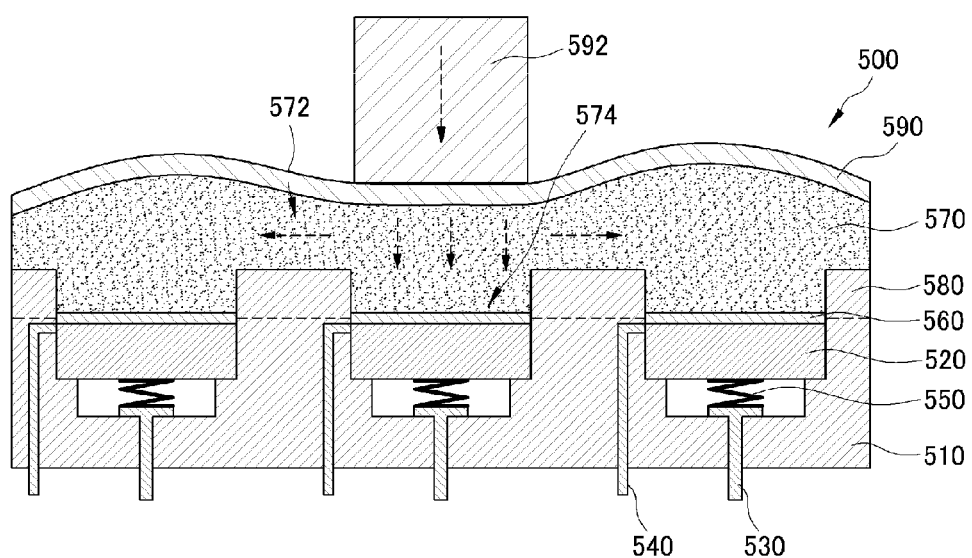

FIGS. 5A and 5B schematically show cross-sectional views of an example piezoelectric power generation system configured to generate electrical power upon application of a mechanical force on a plurality of solid particles contained in a plurality of piezoelectric power generators, arranged in accordance with at least some embodiments described herein. As depicted, a piezoelectric power generation system 500 may include one or more of a plurality of piezoelectric power generators, each of which (as indicated by a dotted box A in FIG. 5A) may include a lower container 510, a piezoelectric device 520 having a top surface 560 and provided in lower container 510, a first output wire 530 electrically coupled to piezoelectric device 520 via a contact spring 550, a second output wire 540 electrically coupled to piezoelectric device 520, and/or a upper container 580 coupled to top surface 560. Elements 510 to 580 may have a similar configuration to elements 110 to 180, respectively, as described above with reference to FIGS. 1 and 2. Thus, a detailed description of elements 510 to 580 is omitted for the sake of simplicity.

In some embodiments, in each piezoelectric power generator A, upper container 580, coupled to top surface 560 and coupled to lower container 510, may be configured to contain a plurality of solid particles 570. Also, an upper portion of piezoelectric power generation system 500 that includes upper containers 580 may be filled with the plurality of solid particles 570.

In some embodiments, piezoelectric power generation system 500 may further include an elastomer mat 590 configured to cover the plurality of solid particles 570 filled in the upper portion of piezoelectric power generation system 500. As illustrated in FIG. 5B, when a mechanical force is vertically exerted by an external object (e.g., a pressure element 592), a bottom surface of pressure element 592 may exert a mechanical force onto elastomer mat 590, which may apply a mechanical stress onto solid particles 570. At the same time, a portion of solid particles 570 below pressure element 592 may exert a mechanical force towards the other portion of solid particles 570. Thus, in the same manner as described above with reference to solid particles 170 and 470 in FIGS. 1 and 4, respectively, solid particles 570 may receive the mechanical force and responsively apply the mechanical stress (e.g., a pulse-patterned force) on top surfaces 560 of piezoelectric devices 520. Thus a converted pulse-patterned force, which may be applied on top surfaces 560 of piezoelectric devices 520, may be efficiently converted into an electrical signal by piezoelectric devices 520.

Figure 5C:
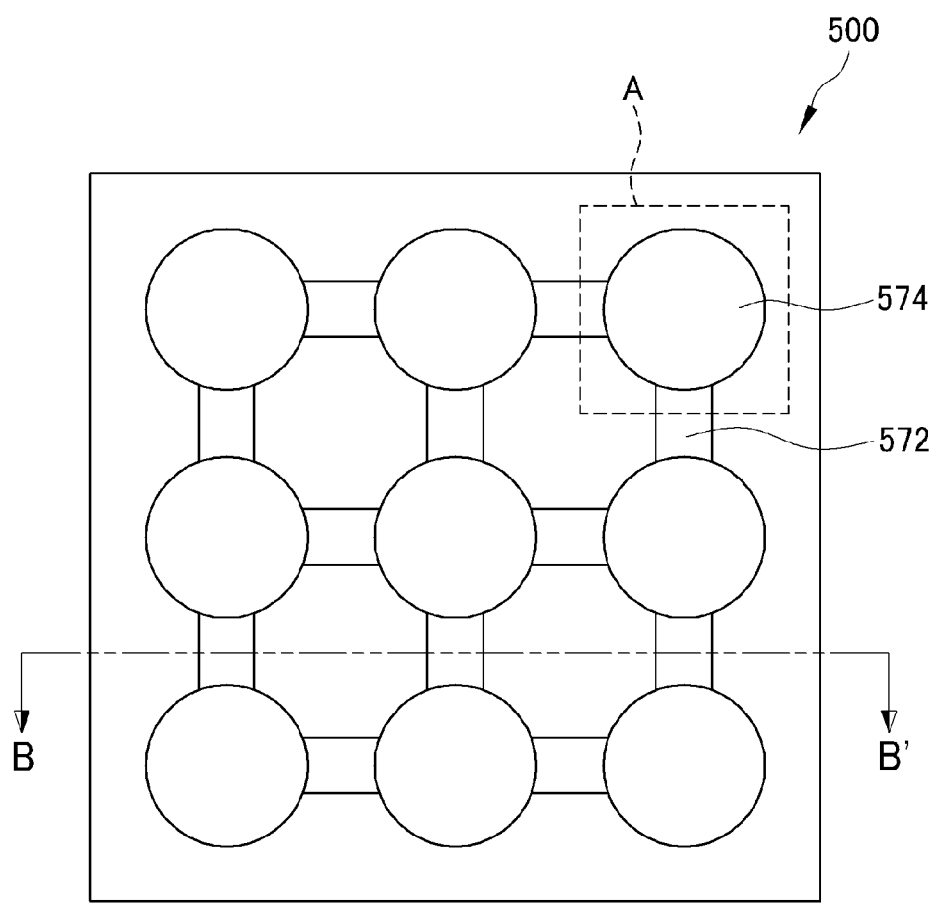
FIG. 5C schematically shows a plane view of an example piezoelectric power generation system configured to generate electrical power upon application of a mechanical force on a plurality of solid particles contained in a plurality of piezoelectric power generators.
Figure 5D:
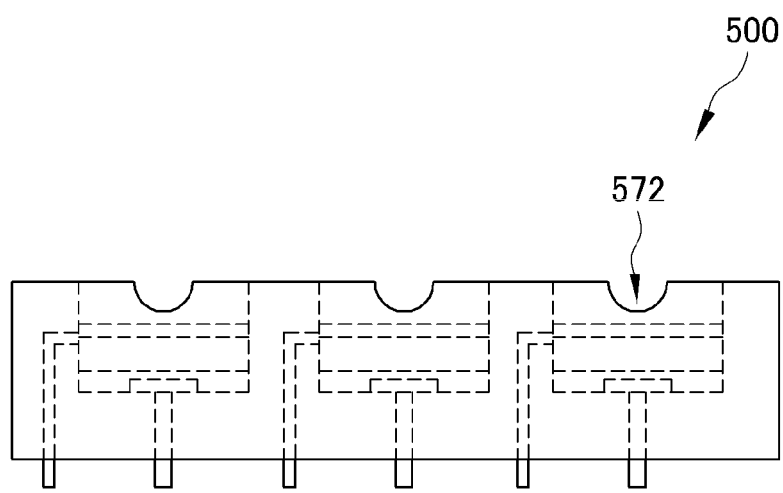
FIG. 5D schematically illustrates a cross-sectional view of an example piezoelectric power generation system, which is taken along a line B-B' in FIG. 5C.

FIG. 5C schematically shows a plane view of an example piezoelectric power generation system configured to generate electrical power upon application of a mechanical force on a plurality of solid particles contained in a plurality of piezoelectric power generators, arranged in accordance with at least some embodiments described herein. Further, FIG. 5D schematically illustrates a cross-sectional view of an example piezoelectric power generation system, which is taken along a line B-B' in FIG. 5C.

As depicted, piezoelectric power generation system 500 may include a plurality of piezoelectric power generators A arranged in a two-dimensional matrix form, where openings 574 of upper containers 580 of piezoelectric power generators A may be coupled to adjacent ones through grooves 572. Thus, when a vertical mechanical force is exerted onto solid particles 570 contained in one or more of piezoelectric power generators A as illustrated in FIGS. 5A and 5B, solid particles 570 may convert such vertical mechanical force into horizontal mechanical force. Thus converted horizontal mechanical force may is exerted on other solid particles 570 contained in adjacent other piezoelectric power generators A through grooves 572.

In some embodiments, the plurality of solid particles 570 may include a plurality of natural D-glucose particles such as a plurality of potato starch having a diameter of about 50 μm. In some other embodiments, the plurality of solid particles 570 may include a plurality of glass particles including quartz material having a diameter in a range of about 200 μm to about 1 mm. Alternatively, the plurality of solid particles 570 may include a plurality of solid plastic particles including unsaturated polyester resin having a diameter in a range of about 200 μm to about 1 mm.

In some embodiments, piezoelectric power generation system 500 may further include a rectifier, such as rectifier 300, configured to receive the electrical signal from piezoelectric device 520 and generate rectified waveforms. Specifically, piezoelectric devices 520 may generate a positive electrical waveform signal when the mechanical force by pressure element 592 is exerted on piezoelectric devices 520 and causes a deformation of piezoelectric devices 520. On the other hand, piezoelectric devices 520 may generate a negative electrical waveform signal when the mechanical force is no longer exerted on piezoelectric devices 520. Such alternating electrical waveform signals may be effectively converted into pulse waveform signals by the rectifier.

The above embodiments may have various applications including, but not limited to, a power generator for home appliance such as a lighting device, a security device, a TV, a refrigerator, etc. In other various examples, the above embodiments may be implemented as a portion of a road, where a car may run over a piezoelectric power generation system such as piezoelectric power generation system 500, and the piezoelectric power generation system can be used to provide electric power for street lighting, traffic lights, traffic monitor devices, telemeters configured to sense weather conditions, deformation of a road, a bridge, etc.

Figure 6:
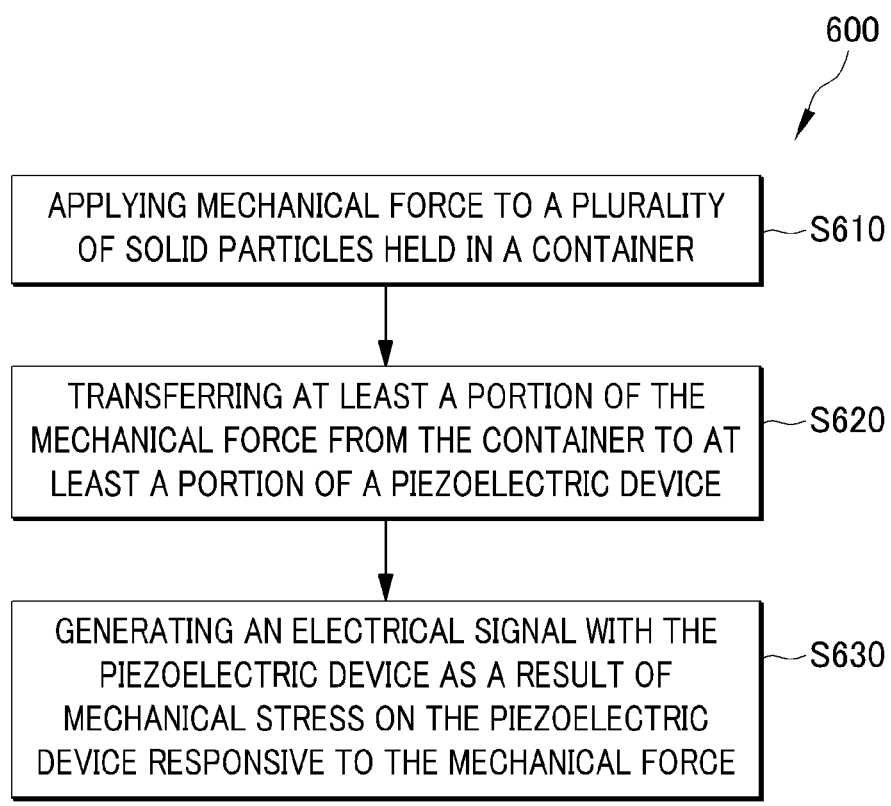
FIG. 6 illustrates an example flow diagram of a method adapted to generate electrical power in a piezoelectric power generator.

FIG. 6 illustrates an example flow diagram of a method adapted to generate electrical power in a piezoelectric power generator, arranged in accordance with at least some embodiments described herein. An example method 600 in FIG. 6 may be implemented using, for example, a computing device including a processor adapted to generate electrical power in a piezoelectric power.

Method 600 may include one or more operations, actions, or functions as illustrated by one or more of blocks S610, S620, and/or S630. Although illustrated as discrete blocks, various blocks may be divided into additional blocks, combined into fewer blocks, or eliminated, depending on the desired implementation. In some further examples, the various described blocks may be implemented as a parallel process instead of a sequential process, or as a combination thereof. Method 600 may begin at block S610, "APPLYING MECHANICAL FORCE TO A PLURALITY OF SOLID PARTICLES HELD IN A CONTAINER."

At block S610, mechanical force may be applied to a plurality of solid particles held in container. As depicted in FIG. 1, mechanical force F may be exerted on solid particles 170 contained in container 180 of piezoelectric power generator 100. Block S610 may be followed by block S620, "TRANSFERRING AT LEAST A PORTION OF THE MECHANICAL FORCE FROM THE CONTAINER TO AT LEAST A PORTION OF A PIEZOELECTRIC DEVICE."

At block S620, at least a portion of the mechanical force may be transferred from the container to at least a portion of a piezoelectric device. As illustrated in FIG. 1, when mechanical force F may be exerted on solid particles 170 held in container 180, solid particles 170 may receive mechanical force F and responsively apply a mechanical stress (e.g., a pulse-patterned force) on top surface 160 of piezoelectric device 120. Such mechanical force conversion may be caused by a stick-slip phenomenon. In particular, the stick-slip may be caused by the surfaces of solid particles 170 alternating between sticking to each other and sliding over each other, with a corresponding change in the force of friction. Block S620 may be followed by block S630, "GENERATING AN ELECTRICAL SIGNAL WITH THE PIEZOELECTRIC DEVICE AS A RESULT OF MECHANICAL STRESS ON THE PIEZOELECTRIC DEVICE RESPONSIVE TO THE MECHANICAL FORCE."

At block S630, an electrical signal may be generated with the piezoelectric device as a result of mechanical stress on the piezoelectric device responsive to the mechanical force. As illustrated in FIG. 1, the pulse-patterned force, which may be transferred from solid particles 170 held in container 180 to top surface 160 of piezoelectric device 120, may be efficiently converted into an electrical signal by piezoelectric device 120. In some embodiments, the plurality of solid particles 170 may include a plurality of natural D-glucose particles. For examples, the natural D-glucose particles may include a plurality of potato starch having a diameter of about 50 μm. In some other embodiments, the plurality of solid particles 170 may include a plurality of glass particles including quartz material having a diameter in a range of about 200 μm to about 1 mm. Alternatively, the plurality of solid particles 170 may include a plurality of solid plastic particles including unsaturated polyester resin having a diameter in a range of about 200 μm to about 1 mm.

In some embodiments, the electrical signal may be provided from the piezoelectric device to a rectifier coupled to the piezoelectric device, which may generate rectified waveforms based on the electrical signal.

In light of the present disclosure, one skilled in the art will appreciate that, for this and other methods disclosed herein, the functions performed in the methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

FIG. 7 shows a schematic block diagram illustrating an example computing system that can be configured to implement methods for generating electrical power in a piezoelectric power generator, arranged in accordance with at least some embodiments described herein. As depicted in FIG. 7, a computer 700 may include a processor 710, a memory 720 and one or more drives 730. Computer 700 may be implemented as a conventional computer system, an embedded control computer, a laptop, or a server computer, a mobile device, a set-top box, a kiosk, a vehicular information system, a mobile telephone, a customized machine, or other hardware platform.

Drives 730 and their associated computer storage media may provide storage of computer readable instructions, data structures, program modules and other data for computer 700. Drives 730 may include a power generation system 740, an operating system (OS) 750, and application programs 760. Power generation system 740 may be adapted to control a piezoelectric power generator or a piezoelectric power generation system in such a manner as described above with respect to FIGS. 1 to 6.

Computer 700 may further include user input devices 780 through which a user may enter commands and data. Input devices can include an electronic digitizer, a camera, a microphone, a keyboard and pointing device, commonly referred to as a mouse, trackball or touch pad. Other input devices may include a joystick, game pad, satellite dish, scanner, or the like.

These and other input devices can be coupled to processor 710 through a user input interface that is coupled to a system bus, but may be coupled by other interface and bus structures, such as a parallel port, game port or a universal serial bus (USB). Computers such as computer 700 may also include other peripheral output devices such as display devices, which may be coupled through an output peripheral interface 785 or the like.

Computer 700 may operate in a networked environment using logical connections to one or more computers, such as a remote computer coupled to a network interface 790. The remote computer may be a personal computer, a server, a router, a network PC, a peer device or other common network node, and can include many or all of the elements described above relative to computer 700.

Networking environments are commonplace in offices, enterprise-wide area networks (WAN), local area networks (LAN), intranets, and the Internet. When used in a LAN or WLAN networking environment, computer 700 may be coupled to the LAN through network interface 790 or an adapter. When used in a WAN networking environment, computer 700 typically includes a modem or other means for establishing communications over the WAN, such as the Internet or a network 795. The WAN may include the Internet, the illustrated network 795, various other networks, or any combination thereof. It will be appreciated that other mechanisms of establishing a communications link, ring, mesh, bus, cloud, or network between the computers may be used.

In some embodiments, computer 700 may be coupled to a networking environment. Computer 700 may include one or more instances of a physical computer-readable storage medium or media associated with drives 730 or other storage devices. The system bus may enable processor 710 to read code and/or data to/from the computer-readable storage media. The media may represent an apparatus in the form of storage elements that are implemented using any suitable technology, including but not limited to semiconductors, magnetic materials, optical media, electrical storage, electrochemical storage, or any other such storage technology. The media may represent components associated with memory 720, whether characterized as RAM, ROM, flash, or other types of volatile or nonvolatile memory technology. The media may also represent secondary storage, whether implemented as storage drives 730 or otherwise. Hard drive implementations may be characterized as solid state, or may include rotating media storing magnetically encoded information.

Processor 710 may be constructed from any number of transistors or other circuit elements, which may individually or collectively assume any number of states. More specifically, processor 710 may operate as a state machine or finite-state machine. Such a machine may be transformed to a second machine, or specific machine by loading executable instructions. These computer-executable instructions may transform processor 710 by specifying how processor 710 transitions between states, thereby transforming the transistors or other circuit elements constituting processor 710 from a first machine to a second machine. The states of either machine may also be transformed by receiving input from user input devices 780, network interface 790, other peripherals, other interfaces, or one or more users or other actors. Either machine may also transform states, or various physical characteristics of various output devices such as printers, speakers, video displays, or otherwise.

FIG. 8 illustrates computer program products that can be utilized to generate electrical power in a piezoelectric power generator, in accordance with at least some embodiments described herein. Computer program product 800 may include a signal bearing medium 802. Signal bearing medium 802 may include one or more instructions 804 that, when executed by, for example, a processor, may provide the functionality described above with respect to FIGS. 1 to 6. By way of example, instructions 804 may include at least one of: one or more instructions for applying mechanical force to a plurality of solid particles held in a container; one or more instructions for transferring at least a portion of the mechanical force from the container to at least a portion of a piezoelectric device; or one or more instructions for generating an electrical signal with the piezoelectric device as a result of mechanical stress on the piezoelectric device responsive to the mechanical force. Thus, for example, referring to FIGS. 1 to 5D, piezoelectric power generator 100 or 400 or piezoelectric power generation system 500 may undertake one or more of the blocks shown in FIG. 6 in response to instructions 804.

In some implementations, signal bearing medium 802 may encompass a computer-readable medium 806, such as, but not limited to, a hard disk drive (HDD), a Compact Disc (CD), a Digital Video Disk (DVD), a digital tape, memory, etc. In some implementations, signal bearing medium 802 may encompass a recordable medium 808, such as, but not limited to, memory, read/write (R/W) CDs, R/W DVDs, etc. In some implementations, signal bearing medium 802 may encompass a communications medium 810, such as, but not limited to, a digital and/or an analog communication medium (e.g., a fiber optic cable, a waveguide, a wired communication link, a wireless communication link, etc.). Thus, for example, program product 800 may be conveyed to one or more modules of piezoelectric power generator 100 or 400 or piezoelectric power generation system 500 by an RF signal bearing medium 802, where the signal bearing medium 802 is conveyed by a wireless communications medium 810 (e.g., a wireless communications medium conforming with the IEEE 802.11 standard).

The present disclosure is not to be limited in terms of the particular embodiments described in this application, which are intended as illustrations of various aspects. Many modifications and variations may be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds, compositions or biological systems, which can, of course, vary. It is also to be understood that the terminology used herein is for the purpose of describing particular embodiments only, and is not intended to be limiting.

The herein described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality, and any two components capable of being so associated can also be viewed as being "operably couplable," to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation, no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general, such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general, such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. An electrical power generator, comprising:
   a piezoelectric device configured to provide an electrical signal upon application of a mechanical stress to the piezoelectric device;
   a plurality of solid particles; and
   a container coupled to at least a portion of a surface of the piezoelectric device, wherein the container is configured to contain the plurality of solid particles,
   wherein, when a mechanical force is exerted on the plurality of solid particles, the plurality of solid particles are effective to receive at least a portion of the mechanical force and responsively apply the mechanical stress to the piezoelectric device.

2. The electrical power generator of claim 1, wherein the piezoelectric device comprises a stack of plates of piezoelectric material.

3. The electrical power generator of claim 1, wherein the surface of the piezoelectric device comprises an elastomer material configured to prevent leakage of the plurality of solid particles into the piezoelectric device.

4. The electrical power generator of claim 3, wherein the elastomer material comprises one or more materials selected from a group consisting of silicon rubber, chloroprene rubber, and fluoroelastomer.

5. The electrical power generator of claim 1, wherein the plurality of solid particles comprise a plurality of natural D-glucose particles.

6. The electrical power generator of claim 5, wherein the plurality of natural D-glucose particles comprises a plurality of potato starch having a diameter in a range of about 2 μm to about 80 μm.

7. The electrical power generator of claim 1, wherein the plurality of solid particles comprises a plurality of glass particles that include quartz material having a diameter in a range of about 200 μm to about 1 mm.

8. The electrical power generator of claim 1, wherein the plurality of solid particles comprises a plurality of solid plastic particles that include unsaturated polyester resin having a diameter in a range of about 200 μm to about 1 mm.

9. The electrical power generator of claim 1, further comprising a rectifier coupled to the piezoelectric device, wherein the rectifier is configured to receive the electrical signal from the piezoelectric device and generate rectified waveforms.

10. The electrical power generator of claim 9, wherein the rectified waveforms include pulse waveforms.

11. The electrical power generator of claim 1, further comprising an elastomer mat configured to cover the plurality of solid particles contained in the container.

12. The electrical power generator of claim 1, further comprising a pressure element mechanically coupled to the container and configured to exert at least the portion of the mechanical force on the plurality of solid particles.

13. The electrical power generator of claim 12, further comprising:
   a spring member mechanically coupled between the pressure element and the container and configured to transfer at least the portion of mechanical force from the pressure element to the plurality of solid particles.

14. The electrical power generator of claim 13, wherein the pressure element comprises a pressure rod.

15. The electrical power generator of claim 1, further comprising an electrical circuit coupled to the piezoelectric device, wherein the electrical circuit is configured to process, transport, or store electrical signal generated by the piezoelectric device.

16. An electrical power generation system, comprising:
   a plurality of piezoelectric devices, wherein each of the plurality of piezoelectric devices is configured to provide a respective electrical signal in response to applied mechanical stress on the piezoelectric device;
   a plurality of solid particles; and
   a container coupled to at least a portion of a surface of each of the plurality of piezoelectric devices, wherein the container is configured to contain the plurality of solid particles, and
   wherein when a mechanical force is exerted on the plurality of solid particles, the plurality of solid particles receive at least a portion of the mechanical force and responsively apply the mechanical stress to at least one of the plurality of piezoelectric devices.

17. The electrical power generation system of claim 16, wherein the at least one of the plurality of piezoelectric devices comprises a stack of plates of piezoelectric material.

18. The electrical power generation system of claim 16, wherein the surface of each of the plurality of piezoelectric devices comprises an elastomer material configured to prevent leakage of the plurality of solid particles into the plurality of piezoelectric devices.

19. The electrical power generation system of claim 18, wherein the elastomer material comprises one or more materials selected from a group consisting of silicon rubber, chloroprene rubber, and fluoroelastomer.

20. The electrical power generation system of claim 16, wherein the plurality of solid particles comprise a plurality of natural D-glucose particles.

21. The electrical power generation system of claim 20, wherein the plurality of natural D-glucose particles comprise a plurality of potato starch having a diameter in a range of about 2 µm to about 80 µm.

22. The electrical power generation system of claim 16, wherein the plurality of solid particles comprise a plurality of glass particles that include quartz material having a diameter of about 200 µm to about 1 mm.

23. The electrical power generation system of claim 16, wherein the plurality of solid particles comprise a plurality of solid plastic particles that include unsaturated polyester resin having a diameter of about 200 µm to about 1 mm.

24. The electrical power generation system of claim 16, further comprising a rectifier coupled to the plurality of piezoelectric devices, wherein the rectifier is configured to receive the respective electrical signal from each of the plurality of piezoelectric devices and to generate rectified waveforms responsive to the respective electrical signal from each of the plurality of piezoelectric devices.

25. The electrical power generation system of claim 24, wherein the rectified waveforms include pulse waveforms.

26. The electrical power generation system of claim 16, further comprising an elastomer mat configured to cover the plurality of solid particles contained in the container.

27. The electrical power generation system of claim 16, further comprising an electrical circuit coupled to the plurality of piezoelectric devices and configured to process, transport, or store the respective electrical signal provided by each of the plurality of piezoelectric devices.

28. A method to generate electrical power in a piezoelectric power generator, the method comprising:
  applying mechanical force to a plurality of solid particles held in a container;
  transferring at least a portion of the mechanical force from the container to at least a portion of a piezoelectric device; and
  generating an electrical signal with the piezoelectric device as a result of mechanical stress on the piezoelectric device responsive to the mechanical force.

29. The method of claim 28, wherein applying the mechanical force to the plurality of solid particles held in the container comprises applying at least the portion of the mechanical force to a plurality of natural D-glucose particles held in the container.

30. The method of claim 28, wherein applying the mechanical force to the plurality of solid particles comprises applying at least the portion of the mechanical force to a plurality of potato starch having a diameter in a range of about 2 µm to about 80 µm held in the container.

31. The method of claim 28, further comprising: receiving, by a rectifier coupled to the piezoelectric device, the electrical signal from the piezoelectric device; and generating rectified waveforms.

* * * * *

UNITED STATES PATENT AND TRADEMARK OFFICE
CERTIFICATE OF CORRECTION

PATENT NO.        : 9,735,708 B2
APPLICATION NO.   : 14/394475
DATED             : August 15, 2017
INVENTOR(S)       : Mihara Page 1 of 1

It is certified that error appears in the above-identified patent and that said Letters Patent is hereby corrected as shown below:

In the Claims

In Column 14, Line 41, in Claim 12, delete "container" and insert -- container, --, therefor.

In Column 14, Line 46, in Claim 13, delete "container" and insert -- container, --, therefor.

In Column 16, Line 8, in Claim 27, delete "devices" and insert -- devices, --, therefor.

Signed and Sealed this
Fifteenth Day of May, 2018

Andrei Iancu
*Director of the United States Patent and Trademark Office*